Figure 1:
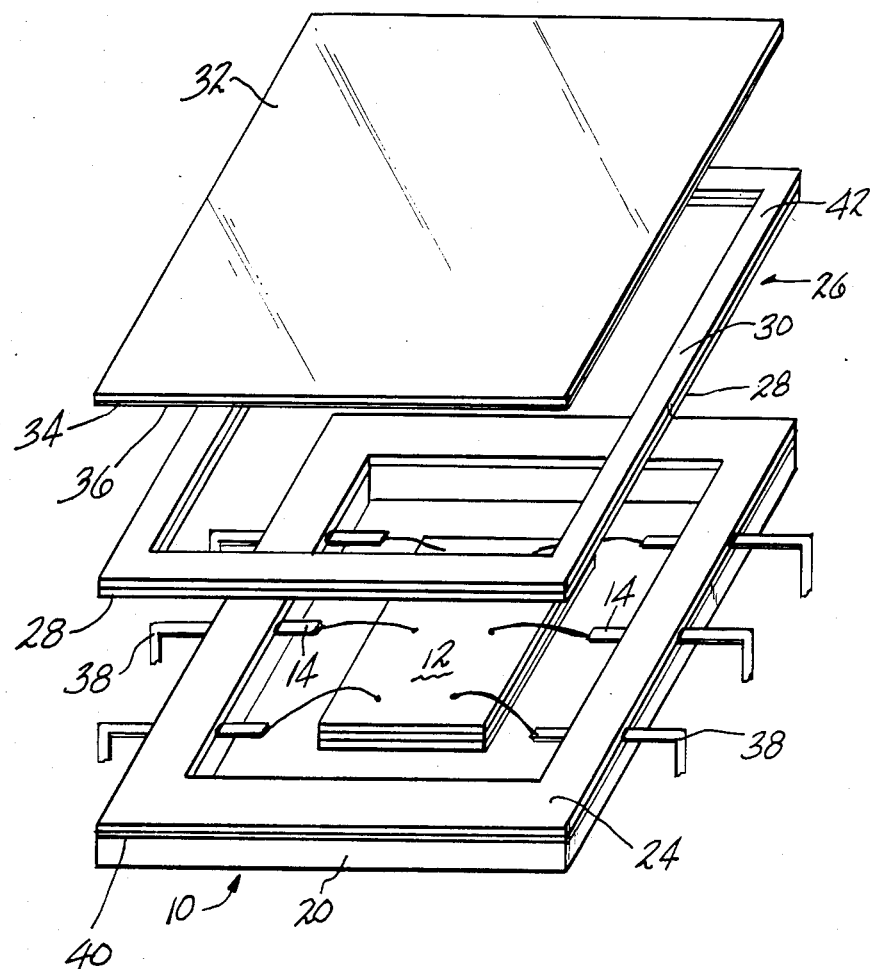

United States Patent [19]

Butt

[11] Patent Number: 4,656,499

[45] Date of Patent: Apr. 7, 1987

[54] HERMETICALLY SEALED SEMICONDUCTOR CASING

[75] Inventor: Sheldon H. Butt, Godfrey, Ill.

[73] Assignee: Olin Corporation, New Haven, Conn.

[21] Appl. No.: 685,864

[22] Filed: Dec. 24, 1984

Related U.S. Application Data

[63] Continuation of Ser. No. 405,640, Aug. 5, 1982, abandoned.

[51] Int. Cl.⁴ .................... H01L 23/02; H01L 23/06; H01L 23/08; H01L 23/10
[52] U.S. Cl. ........................................ 357/74; 357/71; 357/73; 174/52 FP
[58] Field of Search .................. 357/74, 71, 80, 73, 357/67, 72; 174/52 FP

[56] References Cited

U.S. PATENT DOCUMENTS

| | | |
|---|---|---|
| 2,999,194 | 9/1961 | Boswell et al. . |
| 3,113,252 | 12/1963 | Matea . |
| 3,340,602 | 9/1967 | Hontz ................................. 29/588 |
| 3,341,369 | 9/1967 | Caule et al. ........................... 148/3 |
| 3,374,537 | 3/1968 | Doelp, Jr. . |
| 3,381,080 | 4/1968 | Stelmak .............................. 357/73 |
| 3,435,516 | 4/1969 | Kilby .................................. 29/627 |
| 3,475,227 | 10/1969 | Caule et al. . |
| 3,546,363 | 12/1970 | Pryor et al. . |
| 3,618,203 | 11/1971 | Pryor . |
| 3,676,292 | 7/1972 | Pryor et al. ........................ 29/195 |
| 3,698,964 | 10/1972 | Caule et al. ........................ 357/67 |
| 3,726,987 | 4/1973 | Pryor et al. ..................... 174/50.61 |
| 3,729,820 | 5/1973 | Ihochi et al. ........................ 357/71 |
| 3,730,779 | 5/1973 | Caule et al. ........................ 357/67 |
| 3,810,754 | 5/1974 | Ford et al. . |
| 3,826,627 | 7/1974 | Pryor et al. ........................ 29/195 |
| 3,826,629 | 7/1974 | Pryor et al. ........................ 29/191 |
| 3,837,895 | 9/1974 | Pryor et al. ........................ 117/70 |
| 3,852,148 | 12/1974 | Pryor et al. ........................ 161/41 |
| 3,988,825 | 11/1976 | Fuchs et al. . |
| 4,149,910 | 4/1979 | Popplewell . |
| 4,385,202 | 5/1983 | Spinelli et al. . |

FOREIGN PATENT DOCUMENTS

| | | |
|---|---|---|
| 1362234 | 4/1964 | France . |
| 2118752 | 7/1972 | France . |
| 2073082 | 3/1981 | United Kingdom . |

OTHER PUBLICATIONS

Weiss, "Hermetic Packages and Sealing Techniques", Semiconductor International, Jun., 1982, pp. 111–119.
Betz et al., IBM Technical Disclosure Bulletin, "Monolithic Chip Carrier", vol. 9, No. 11, Apr. 1967.
Charles A. Harper, "The Handbook of Electronic Packing", pp. 9-27.

Primary Examiner—Martin H. Edlow
Assistant Examiner—S. V. Clark
Attorney, Agent, or Firm—Howard M. Cohn; Barry L. Kelmachter; Paul Weinstein

[57] ABSTRACT

An improved hermetically sealed semiconductor casing and a process for producing the casing are disclosed. This casing includes a lead frame having an electrical device affixed thereto. A base member is glass bonded to a matching surface of the lead frame. A metal window frame shaped device is provided having one surface with a refractory oxide coating and a second opposite readily solderable surface. The refractory oxide layer of the window frame device is glass bonded to the lead frame and the base member. The semiconductor or electrical device is connected to the lead frame after the window frame has been glass bonded into place. A metal lid having a solderable surface is solder bonded to the solderable surface of the window frame to hermetically seal the electrical device within the casing.

6 Claims, 2 Drawing Figures

U.S. Patent  Apr. 7, 1987  4,656,499

HERMETICALLY SEALED SEMICONDUCTOR CASING

This application is a continuation of application Ser. No. 405,640, filed Aug. 5, 1982, now abandoned.

The present invention relates to U.S. Pat. No. 4,461,924, entitled "Semiconductor Casing" by S. H. Butt; U.S. patent application Ser. No. 369,699 entitled "Improved Printed Circuit Board" by S. H. Butt, filed Apr. 19, 1982; U.S. patent application Ser. No. 369,785 entitled "Improved Chip Carrier" by S. H. Butt, filed Apr. 19, 1982, (now abandoned); and U.S. patent application Ser. No. 398,497 entitled "Improved Semiconductor Casing" by S. H. Butt, filed July 15, 1982.

While the invention is subject to a wide range of applications, it is especially suited for providing an article and a method of encasing a semiconductor and more particularly for providing a highly reliable hermetically sealed casing with a window frame device to allow for relatively low temperature packaging after the semiconductor device is installed.

Hermetically sealed packages are used in applications in which maximum reliability is required. This is usually accomplished with ceramics or metals which are impervious to water vapor or other contaminants in the package together with sealing glasses which are also impervious to diffusion. Characteristically, the present hermetic packages cost much more than a plastic package, generally in the order of ten times greater.

In producing a hermetically sealed package, the present technology often uses the following sequence of operations. First, a preformed and prefired ceramic substrate is provided. A metallized spot is applied to the center of this substrate to provide for later attachment of a semiconductor chip. Typically, the metallized spot is gold and the ceramic is normally aluminum oxide (alumina). Under exceptional circumstances, when high thermal dissipation is mandatory, the ceramic substrate may be produced from beryllium oxide. However, this is usually avoided because of the very high cost of beryllium oxide ceramics. Next, a layer of sealing glass is silk screened as a paste around the periphery of the substrate. Then, a lead frame is placed upon the glass and the resulting subassembly is passed through a furnace so that the glass fuses, bonding to the ceramic as well as to the lead frame. Normally, the lead frame material is striped with aluminum in its central area to provide an aluminum surface where lead wires are to be subsequently bonded.

Typically, a low expansivity metal alloy such as 42 nickel-58 iron is used for the lead frame. These alloys are chosen because it is quite advantageous for the coefficient of thermal expansion of the alloy to approximately match that of the ceramic. The glass in turn is selected to provide a coefficient of thermal expansion comparable to that of the 42 nickel alloy and the ceramic. Close matching of coefficients of thermal expansion is required in order to maintain bond integrity and/or to avoid fracture of the glass. Either or both of these failures may result from the stresses developed while the package is cooling from the sealing temperature. Glass sealing alloys such as the 42 nickel alloy are relatively expensive. Their cost is approximately twice the cost of normal copper alloys. Furthermore, the thermal and electrical conductivity of the typical glass sealing alloys is relatively low, approximately 4% that of pure copper. (Alloy 6381 has about 10% the thermal conductivity of pure copper.) To promote adhesion between a lead frame of 42 nickel alloy or similar compositions and the glass, it is generally necessary to add a preoxidizing operation to develop a suitable oxide layer upon the surface of the metal for bonding to the glass.

The chip is now bonded to the metallized spot on the substrate using a standard gold-silicon eutectic braze bonding technique. The interconnection between the chip and the lead frame may be made by bonding small diameter lead wires between the two.

Next, sealing glass is silk screened upon the surface of the upper ceramic component. Finally, the upper component is placed over the previous subassembly and again fired so as to fuse the glass which bonds the package together into a single hermetic unit.

The preceding discussion has generally described the process of producing a typical "leaded" hermetic glass-ceramic package.

Various other techniques are known in the art for hermetically sealing semiconductor devices in a metal package. For example, cold pressure welding is used to hermetically seal a metal housing as taught in U.S. Pat. No. 2,999,194 to Boswell et al. and in U.S. Pat. No. 3,988,825 to Fuchs et al. In addition, hermetically sealing an enclosure without the use of heat is disclosed in U.S. Pat. No. 3,113,252 to Matea.

U.S. patent application Ser. No. 390,081, now abandoned, entitled "Semiconductor Casing", U.S. Pat. No. 4,410,927 entitled "Improved Semiconductor Package", and U.S. patent application Ser. No. 398,497, now abandoned, entitled "An Improved Semiconductor Casing", all by Sheldon H. Butt are directed to improvements in semiconductor packaging.

U.S. Pat. No. 3,340,602 to Hontz discloses, for example, ". . . the invention contemplates, in preferred practice thereof, the use of a gold-tin alloy soldier, preferably 20% tin by weight, to solder bond a gold plated cap to a gold plated housing within which there is disposed a silicon semi-conductive device comprising gold-to-aluminum solder connections."

U.S. Pat. No. 3,435,516 to Kilby discloses, for example, ". . . methods of fabricating packages for semiconductor devices and methods for mounting and/or sealing bars of thin semiconductive materials having various circuit connections and terminals formed thereon."

A general review of hermetic sealing is disclosed in an article entitled "Hermetic Packages and Sealing Techniques", by Aaron Weiss in *Semiconductor International*, June, 1982.

U.S. Pat. No. 3,546,363 to Pryor et al. discloses a composite metal product for use as a seal to glasses and ceramics which has properties of a low coefficient of expansion, approximating that of the appropriate glasses and ceramics, good thermal conductivity, and fine grain size in the annealed condition.

U.S. Pat. Nos. 3,546,363; 3,618,203; 3,676,292; 3,726,987; 3,826,627; 3,826,629; 3,837,895; 3,852,148; and 4,149,910 disclose glass or ceramic to metal composites or seals wherein the glass or ceramic is bonded to a base alloy having a thin film of refractory oxide on its surface.

It is a problem underlying the present invention to provide a hermetically sealed semiconductor casing for an electrical device to increase the reliability of semiconductor packages at a reasonable cost.

It is an advantage of the present invention to provide a hermetically sealed semiconductor casing for an electrical device which obviates one or more of the limitations and disadvantages of the described prior arrangements.

It is a further advantage of the present invention to provide a hermetically sealed semiconductor casing for an electrical device which uses relatively inexpensive materials.

It is a yet further advantage of the present invention to provide a hermetically sealed casing for an electrical device which permits rapid wire bonding for improved speed of productivity.

It is a still further advantage of the present invention to provide a process for hermetically sealing a casing for an electrical device which minimizes problems associated with mismatch between the coefficient of thermal expansion of the semiconductor device and the alloy component to which it is attached.

Accordingly, there has been provided an improved hermetically sealed semiconductor casing and a process for producing the casing. This casing includes a lead frame having an electrical device affixed thereto. A base member is glass bonded to a matching surface of the lead frame. A metal window frame shaped device is provided having one surface with a refractory oxide coating and a second opposite readily solderable surface. The refractory oxide layer of the window frame device is glass bonded to the lead frame. The semiconductor or electrical device is connected to the lead frame after the window frame has been glass bonded into place. A metal lid having a solderable surface is solder bonded to the solderable surface of the window frame to hermetically seal the electrical device within the casing.

Figure 2:
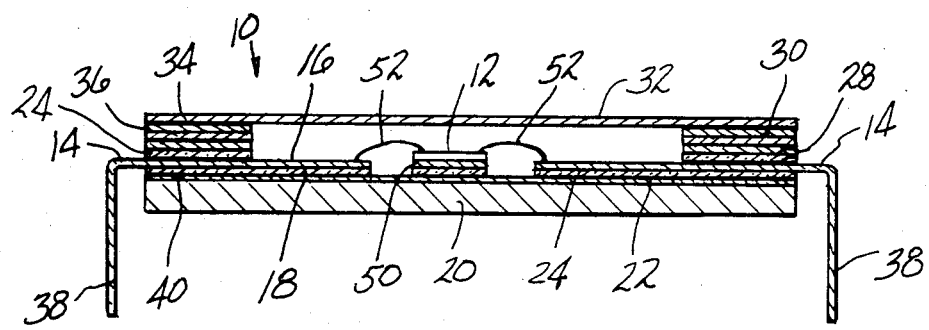

FIG. 1 is an exploded view of the elements of a hermetically sealed semiconductor casing adapted for assembly in accordance with the present invention; and FIG. 2 is a side view in cross section of a hermetically sealed semiconductor casing in accordance with the present invention.

An improved hermetically sealed casing 10, as seen in FIGS. 1 and 2, for an electrical device 12 is disclosed. A metal or metal alloy lead frame 14 has first and second opposite surfaces 16 and 18 and the electrical device or chip 12 affixed thereto. A metal or metal alloy base member 20 has a surface 22 which is bonded by glass 24 to the second surface 18 of the lead frame. A metal or metal alloy window frame shaped device 26 has at least a first surface 28 with a refractory oxide coating (not illustrated). The window frame 26 also has a second opposite surface 30 which is readily solderable. A metal or metal alloy lid or cover 32 has at least a first readily solderable surface 34. Solder 36 is interposed between the second surface 30 of the window frame device and the first surface 34 of the lid 32 so that the electrical component 12 is substantially hermetically sealed within the casing 10.

The metal substrate or base member 20 may consist primarily of a high thermal conductivity metal or metal alloy such as for example copper or aluminum metals or alloys. To provide improved glass bonding strength, the high conductivity metal or alloy substrate may be completely formed or preferably clad with a thin layer 40 of any desired metal or alloy which bonds strongly with a glass bonding agent. The preferred metal or alloy of the present invention which bonds with a glass bonding agent has a thin refractory oxide layer on its surface. The preferred alloy is a copper base alloy containing from 2 to 12% aluminum and the balance copper. Preferably, the alloy contains from 2 to 10% aluminum, 0.001 to 3% silicon and, if desired, a grain refining element selected from the group consisting of iron up to 4.5%, chromium up to 1%, zirconium up to 0.5%, cobalt up to 1% and mixtures of these grain refining elements and the balance copper. In particular, CDA alloy C6381 containing 2.5 to 3.1% aluminum, 1.5 to 2.1% silicon, and the balance copper is useful as a substrate layer 40 for this invention. Also, CDA alloy C638, as disclosed in U.S. Pat. No. 3,676,292 to Pryor et al., is suitable. Alloy C638 is similar to C6381 except for the addition of cobalt. Impurities may be present in either alloy which do not prevent bonding in a desired embodiment.

One of the alloys useful with this invention, CDA alloy C6381 as described in U.S. Pat. Nos. 3,341,369 and 3,475,227 to Caule et al. which disclose copper base alloys and processes for preparing them, have a refractory oxide layer formed to one or more of their surfaces. The oxide layer may include complex oxides formed with elements such as alumina, silica, tin, iron chromia, zinc, and manganese. Most preferably, the refractory oxide layer is substantially aluminum oxide ($Al_2O_3$). The formation of the refractory oxide to the substrate may be accomplished in any desired manner. For example, a copper base alloy such as alloy C6381 may be preoxidized in gases having an extremely low oxygen content. The C6381 may be placed in a container with 4% hydrogen, 96% nitrogen and a trace of oxygen released from a trace of water mixed in the gas. This gas may be heated to a temperature of between about 330° C. and about 820° C. Depending on the temperature and amount of time the alloy is left in the heated gas, a refractory oxide layer of a desired thickness forms on the surface of the alloy.

The present invention is not restricted to applications of alloy C6381 but includes the broad field of metal or alloys which have the ability to form continuous refractory oxide layers on their surface. Several examples of other metal alloys such as nickel base and iron base alloys are disclosed in U.S. Pat. Nos. 3,698,964, 3,730,779 and 3,810,754. Alloy C6381 is particularly suitable for this invention because it is a commercial alloy which forms such films when heated.

The lead frame 14 is also constructed of a metal or alloy, as described above, which bonds well to glass. Preferably, the lead frame is formed of C6381 and has a refractory oxide formed on surfaces 16 and 18.

As seen in FIG. 2, the terminal leads 38 project through the glass component 24 external to the casing 10. Although the terminal leads preferably protrude from two sides of the casing, it is within the scope of the present invention for the terminal leads to extend from any number of sides.

The present invention uses any suitable solder glass or ceramic 24 preferably having a coefficient of thermal expansion/contraction which closely matches the metal components. The glass may be bonded to the thin refractory oxide surface layers on component 40 and lead frame 14 and functions to adhere the metal components together and electrically insulate them from each other. When the glass and the copper alloy substrates preferably have the same or closely matched coefficients of thermal expansion, thermal stresses in the system may be essentially eliminated and the problems associated with thermal stress in the finished product alleviated. However, the specific character of the refractory oxide layer present on the preferred alloys C638 or C6381 allows bonding to solder glasses with significantly lower expansion/contraction coefficients than that of the alloy. It has been demonstrated that mechanically sound bonds can be achieved between C638 (coefficient of thermal expansion of $170 \times 10^{-7}$ in/in/°C.) and CV432 (contraction coefficient of $127 \times 10^{-7}$°C.).

Table I lists various exemplary solder glasses which are adapted for use in accordance with this invention.

TABLE I

| Solder Glass or Ceramic Type | Coefficient of Thermal Expansion, in./in./°C. |
|---|---|
| Ferro Corp.[1] No. RN-3066-H | $167 \times 10^{-7}$ |
| Ferro Corp.[1] No. RN-3066-S | $160 \times 10^{-7}$ |
| Owens Illinois[2] No. EJ3 | $160 \times 10^{-7}$ |
| Owens Illinois[2] No. CV432 | $127 \times 10^{-7}$ |

[1]Proprietary composition manufactured by Ferro Corporation, Cleveland, Ohio.
[2]Proprietary composition manufactured by Owens Illinois Corporation, Toledo, Ohio.

The window frame shaped element 26 may be formed of a composite of a metal or alloy having a refractory oxide layer on one surface such as for example CDA alloy C6381 or any other metal or alloy having the ability to form continuous refractory oxide layers on their surface as mentioned hereinabove. This allows the window frame to be securely bonded to glass 24 in a conventional manner. Although the window frame may be formed of a single metal or alloy, it is preferably provided with a cladding 42 of a more readily solderable alloy such as CDA alloy C151.

The lid or top cover 32 is also fabricated from a suitable solderable metal or alloy, such as for example a copper or aluminum metal or alloy, preferably CDA alloy C151, as described above. However, it is within the scope of the present invention to use any solderable metal or alloy to form the lid 32 or component 42 of the window frame 26. The advantage of having the opposing surfaces 34 and 30 of the lid 32 and the window frame 26, respectively, to be readily solderable permits the use of much less expensive solders and eliminates the need to gold plate the components as in the prior art.

The solder 36 may be comprised of any conventional solder depending on the requirements of the application. For example, if there is a need to avoid flux, a gold-tin solder mixture might be desirable. Also, in an application having a low temperature restraint, a lead-tin solder might be desirable.

The semiconductor chip 12 is bonded to the pad 50 of the lead frame 14. This bonding may be accomplished by either using a conductive adhesive as is often the case in integrated circuits or a relatively low melting temperature solder. Typically, the plastic adhesives include epoxies and polyimides. They may be formulated with powdered metals, such as silver, to improve their thermal conductivity and/or to provide moderate electrical conductivity. The metal joining materials may include a gold-tin or lead-tin eutectic solder. In addition, it is within the scope of the present invention to use any desired solder or other bonding technique as required.

The interconnection between the chip 12 and the lead frame 14 is typically provided by means of small diameter lead wires 52 (usually gold) which are metallurgically bonded to the tips of the leads in the lead frame and to the chip. The bonding technique is preferably either thermosonic or thermocompression bonding. Thermosonic bonding is a combination of mechanically induced metallurgical bonding at temperatures above ambient in conjunction with the addition of ultrasonic energy. Thermocompression bonding is mechanical deformation at elevated temperature without the addition of the ultrasonic energy. A foil "spider" is often used as an alternative to the wires. The foil itself may be bonded to the chip by either thermosonic or thermocompression bonding. These techniques of bonding are substituted for the slower ultrasonic bonding required for aluminum wires used in the conventional glass sealed hermetic packages.

The sequence of manufacturing the improved hermetic semiconductor casing 10 of the present invention is provided hereinbelow with certain advantages pointed out. First, the lead frame 14 is glass sealed with glass 24 to the refractory oxide surface on cladding 40 of base member 20. Then, the window frame shaped device has its refractory oxide coated surface 28 bonded to the glass 24 which is bonding the lead frame to the metal substrate. Note that the glass may actually be between the metal substrate and the window frame in areas not covered by the lead frame. Although these steps are disclosed as being separate, they may actually be performed concurrently. Now that the high temperature operations are concluded, the semiconductor chip 12 is mounted upon the pad 50. By removing the need to subject the package to relatively high glass sealing temperatures, the chip may be attached to the substrate with a relatively low melting temperature solder or even an organic adhesive. In either case, the problems associated with the mismatch in thermal conductivity between the chip and the pad are minimized. This is due to the fact that the temperature difference between the chip bonding temperature and the ambient temperature is substantially less than in the case of gold-silicon eutectic braze bonding as is often required in conventional hermetically sealed semiconductor casings. In addition, the wires 52 between the lead frame and the chip may be thermocompression or thermosonically bonded. This can eliminate the slower ultrasonic wire bonding used in glass sealed hermetic packages since the final closure using relatively low temperature solder does not have a substantial adverse effect on the bonding wires 52. Finally, a lid or cover 32 is soldered to the window frame to hermetically seal the semiconductor device in the casing 10. Also, the surfaces which are soldered are preferably formed of a readily solderable copper alloy which permits the use of relatively inexpensive solders and eliminates the need to gold plate the soldered components. The solderable metals, as described above, are characteristically substantially less costly than the low expansivity alloys which are frequently used in the present technology.

The patents, patent applications and publication set forth in this application are intended to be incorporated by reference herein.

It is apparent that there has been provided in accordance with this invention an improved hermetically semiconductor casing for an electrical component and a process for manufacturing the casing which satisfies the objects, means, and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A hermetically sealed semiconductor casing for an electrical component, comprising:
   a metal or metal alloy lead frame having first and second opposite surfaces and being adapted to have said electrical component connected thereto, each of said first and second surfaces having a first refractory oxide layer thereon;
   a metal or metal alloy base member having a second refractory oxide layer on at least one surface thereof;
   a metal or metal alloy window frame shaped component comprising a cladding of first and second metal or metal alloy components, said first metal or metal alloy component having at least a first surface with a third refractory oxide layer thereon to produce improved glass or ceramic bonding strength, said second metal or metal alloy component having at least a first surface being readily solderable;
   said metal alloy lead frame, metal alloy base member, and said first metal alloy component of said window frame component are formed of a first copper alloy having a coefficient of thermal expansion of about $170 \times 10^{-7}$ in/in/°C.;
   a metal or metal alloy lid having at least a first surface being readily solderable;
   a glass or ceramic component having a coefficient of thermal expansion of at least about $160 \times 10^{-7}$ in/in/°C., said coefficient of thermal expansion of said glass or ceramic component being closely matched to the coefficient of thermal expansion of said metal or metal alloy lead frame, said metal or metal alloy base member, and the first metal or metal alloy component of said window frame shaped component, said glass or ceramic component bonding said first and second refractory oxide layers and said first and third refractory oxide layers for substantially eliminating thermal stress within said casing; and
   solder means bonding the first readily solderable surface of the second component of said window frame component to the first readily solderable surface of the metal or metal alloy lid whereby said semiconductor casing is substantially hermetically sealed.

2. The semiconductor casing as in claim 1 wherein said first copper alloy comprises an effective amount of up to about 12% aluminum to form a refractory oxide and the balance essentially copper.

3. The semiconductor casing as in claim 1 wherein said first, second and third refractory oxide layers include $Al_2O_3$.

4. The semiconductor casing as in claim 3 wherein said base member includes a cladding of a substantially high conductivity metal or alloy for providing improved thermal conductivity from said casing.

5. The semiconductor casing as in claim 4 further including said metal or metal alloy lid being formed of a second copper or copper alloy.

6. The semiconductor casing as in claim 4 wherein said first copper base alloy consists essentially of 2.5 to 3.1% aluminum, 1.5 to 2.1% silicon, and the balance essentially copper.

* * * * *